(12) United States Patent
Krueger et al.

(10) Patent No.: US 7,816,273 B2
(45) Date of Patent: Oct. 19, 2010

(54) TECHNIQUE FOR REMOVING RESIST MATERIAL AFTER HIGH DOSE IMPLANTATION IN A SEMICONDUCTOR DEVICE

(75) Inventors: Christian Krueger, Liegau-Augustusbad (DE); Volker Grimm, Langebrueck (DE); Lutz Eckart, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 51 days.

(21) Appl. No.: 11/782,922

(22) Filed: Jul. 25, 2007

(65) Prior Publication Data
US 2008/0160729 A1  Jul. 3, 2008

(30) Foreign Application Priority Data
Dec. 29, 2006  (DE)  .................. 10 2006 062 035

(51) Int. Cl.
*H01L 21/425* (2006.01)
*H01L 21/461* (2006.01)
(52) U.S. Cl. .................. 438/725; 438/531; 257/21.214
(58) Field of Classification Search .................. 438/514, 438/531, 706, 725, 745, 739; 134/1.2, 1.3
See application file for complete search history.

(56) References Cited

U.S. PATENT DOCUMENTS

| | | | | |
|---|---|---|---|---|
| 4,861,424 A | * | 8/1989 | Fujimura et al. ............... | 216/67 |
| 5,811,358 A | * | 9/1998 | Tseng et al. .................. | 438/725 |
| 5,895,272 A | * | 4/1999 | Li ................. | 438/705 |
| 6,805,139 B1 | * | 10/2004 | Savas et al. ................... | 134/1.3 |
| 2002/0151156 A1 | * | 10/2002 | Hallock et al. .............. | 438/531 |
| 2005/0054209 A1 | * | 3/2005 | Hsu et al. .................... | 438/725 |
| 2005/0227482 A1 | * | 10/2005 | Korzenski et al. ........... | 438/639 |
| 2006/0024972 A1 | | 2/2006 | Hall et al. ................... | 438/725 |
| 2008/0102644 A1 | * | 5/2008 | Goto et al. .................. | 438/710 |

FOREIGN PATENT DOCUMENTS

JP  01101633 A  4/1989

OTHER PUBLICATIONS

Translation of Official Communication from German Patent Office for German Patent Application No. 10 2006 062 035.6-43 dated Jul. 13, 2007.

\* cited by examiner

*Primary Examiner*—Savitri Mulpuri
(74) *Attorney, Agent, or Firm*—Williams, Morgan & Amerson, P.C.

(57) ABSTRACT

Resist masks exposed to high-dose implantation processes may be efficiently removed on the basis of a combination of a plasma-based etch process and a wet chemical etch recipe, wherein both etch steps may include a highly selective etch chemistry in order to minimize substrate material loss and thus dopant loss in sophisticated semiconductor devices. The first plasma-based etch step may provide under-etched areas of the resist mask, which may then be efficiently removed on the basis of the wet chemical etch process.

17 Claims, 5 Drawing Sheets

TECHNIQUE FOR REMOVING RESIST MATERIAL AFTER HIGH DOSE IMPLANTATION IN A SEMICONDUCTOR DEVICE

BACKGROUND OF THE INVENTION

1. Field of the Invention

The present disclosure generally relates to the fabrication of integrated circuits, and, more particularly, to the fabrication of highly sophisticated field effect transistors, such as MOS transistor structures, requiring highly doped shallow junctions formed on the basis of resist masks.

2. Description of the Related Art

The manufacturing process for integrated circuits continues to improve in several ways, driven by the ongoing efforts to scale down the feature sizes of the individual circuit elements. A key issue in developing integrated circuits of increased packing density and enhanced performance is the scaling of transistor elements, such as MOS transistor elements, to provide the great number of transistor elements that may be necessary for producing modern CPUs and memory devices. One important aspect in manufacturing field effect transistors having reduced dimensions is the reduction of the length of the gate electrode that controls the formation of a conductive channel separating the source and drain regions of the transistor. The source and drain regions of the transistor element are conductive semiconductor regions including dopants of an inverse conductivity type compared to the dopants in the surrounding crystalline active region, e.g., a substrate or a well region.

Although the reduction of the gate length is necessary for obtaining smaller and faster transistor elements, it turns out, however, that a plurality of issues are additionally involved to maintain proper transistor performance for a reduced gate length. One challenging task in this respect is the provision of shallow junction regions, i.e., source and drain regions, which nevertheless exhibit a high conductivity so as to minimize the resistivity in conducting charge carriers from the channel to a respective contact area of the drain and source regions. The requirement for shallow junctions having a high conductivity is commonly met by performing an ion implantation sequence to obtain a high dopant concentration having a profile that varies laterally and in depth.

Generally, the ion implantation process is a viable technique for introducing certain dopant species, such as P-type dopants, N-type dopants and the like, into specified device areas, which are usually defined by appropriate implantation masks, such as resist masks and the like. During the definition of active transistor regions, such as P-wells and N-wells, and during the formation of the actual drain and source dopant profiles, respective resist masks are typically provided to selectively expose and cover the device areas to introduce the required type of dopant species. That is, the respective implant species is introduced into non-covered device portions while the resist material blocks the dopant species and prevents dopant penetration into covered device portions, wherein the average penetration depth is determined by the implantation energy for a given implant species and a given material composition of the device area, while the dopant concentration is determined by the implantation dose and the implantation duration. Thereafter, the resist mask is removed and a further implantation process may be performed according to device requirements on the basis of a newly formed resist mask. Hence, a plurality of implantation processes are to be performed during the formation of transistor elements, thereby also requiring a plurality of resist removal processes.

Due to the demand for extremely shallow junctions, i.e., drain/source dopant profiles, in particular in portions located in the vicinity of the channel region, which are also referred to as drain/source extensions, moderately low implantation energies at high doses are to be used, thereby resulting in specific difficulties during the resist removal process, as will be described with reference to FIGS. 1a-1b in more detail.

FIG. 1a schematically illustrates a cross sectional view of a conventional semiconductor device 100 during a manufacturing stage, in which appropriate dopant profiles are to be selectively formed in active areas of transistor elements. The semiconductor device 100 comprises a substrate 101, which may represent any appropriate carrier material for forming therein or thereon respective circuit elements, such as transistors, capacitors and the like. For example, the substrate 101 may represent a silicon bulk substrate or a silicon-on-insulator (SOI) substrate, since the vast majority of complex integrated circuits, such as CPUs, storage chips and the like, are and will be in the foreseeable future formed on the basis of silicon. The device 100 may further comprise a corresponding semiconductor layer 102, which may represent a silicon layer and the like, in which may be defined, for instance on the basis of isolation structures 103, a first device region 110 and a second device region 120, which may, for instance, correspond to respective active areas of transistor elements to be formed in and on the first and second device regions 110, 120. Furthermore, in the manufacturing stage shown in FIG. 1a, respective gate electrodes 111, 121 may be formed above the material of the semiconductor layer 102 and may be separated therefrom by respective gate insulation layers 113 and 123, respectively. As previously explained, in highly sophisticated semiconductor devices, the ongoing shrinkage of feature sizes may demand a gate length, i.e., in FIG. 1a, the horizontal extension of the gate electrodes 111, 121, of 50 nm and significantly less, thereby also necessitating sophisticated dopant profiles in the first and second device areas 110, 120. Furthermore, the gate electrodes 111, 121 may have formed thereon a corresponding sidewall spacer structure 112, 122, which may act as an implantation mask for laterally profiling the dopant concentration to be formed in the semiconductor material of the first and second device regions 110, 120. Moreover, the device 100 comprises a resist mask 104, which covers the first device region 110 and exposes the second device region 120 to an ion bombardment of a respective implantation process 105.

The semiconductor device 100 as shown in FIG. 1a may be formed on the basis of the following processes. After providing the substrate 101 having formed thereon the semiconductor layer 102, possibly including a buried insulating layer (not shown) when an SOI configuration is considered, the first and the second device regions 110, 120 may be defined by forming the isolation structures 103. For this purpose, well-established techniques may be used, including photolithography, anisotropic etch, deposition and polishing techniques, for forming the isolation structures 103 in the form of shallow trench isolations. Thereafter, an appropriate masking regime may be used in order to selectively cover the first and the second device regions 110, 120 for establishing appropriate vertical dopant profiles in order to establish basic transistor characteristics, such as the conductivity type of the transistor under consideration, the threshold voltage thereof and the like. The corresponding implantation sequences may be performed on the basis of well-established process parameters, such as implantation energy, implantation dose and the like, wherein, typically, the required dopant concentrations may be significantly less compared to the dopant concentrations required during the definition of PN junctions in the device regions 110, 120. Consequently, moderately low implantation doses may be used in combination with appropriate implantation energies, thereby maintaining the interaction of the implant species with the corresponding resist materials at a low level, thus allowing the removal of the corresponding resist materials after implantation on the basis of well-established plasma or wet chemical etch processes.

Thereafter, the gate insulation layers 113, 123 may be formed on the basis of well-established oxidation and/or deposition processes followed by the patterning of the gate electrodes 111, 121, wherein respective lateral dimensions thereof may be adjusted to the above-specified range. Next, the sidewall spacer structures 112, 122 may be formed by well-established techniques, such as the deposition of an appropriate material followed by an anisotropic etch process, oxidation techniques and the like. It should be appreciated that, in this manufacturing stage, a respective screen or pad layer may also be formed above the first and second device regions 110, 120, for instance in the form of an oxide layer, in order to protect exposed surfaces of the semiconductor material of the layer 102 and enhancing the subsequent implantation process 105. For convenience, any such layers are not shown in FIG. 1a.

Thereafter, the resist mask 104 may be formed on the basis of photolithography techniques and, subsequently, the device 100 may be subjected to the implantation process 105, which may be designed to obtain a shallow dopant profile 124, which may represent an extension region of a corresponding drain and source region still to be formed in a later manufacturing stage. As previously explained, the extension regions 124 may require a moderately high dopant concentration, thereby necessitating high implantation dose values in order to obtain the desired high dopant concentration at an acceptable process time. Since only a very restricted average penetration depth is required for the extension regions 124, which may be several nanometers and even less for highly sophisticated semiconductor devices, the corresponding implantation energies may range from several keV (kilo electron volts) to 1 keV or less depending on the type of dopant species, the thickness of a corresponding pad layer, if provided, the type of semiconductor material and the like. Consequently, the ion bombardment during the implantation 105 may cause significant damage on exposed surface portions of the resist mask 104, thereby creating a crust layer 104A, which may comprise carbonized resist material imparting significantly different mechanical and chemical characteristics to the basic resist material of the mask 104. For example, the crust layer 104A, having a high density compared to the substantially non-implanted resist material 104B, may cause a significantly different behavior during well-established plasma-based or wet chemical etch processes for removing resist material, thereby typically requiring additional reactive components in order to first etch the resist crust layer 104A prior to completely removing the residual resist material 104B. The additional etch chemistry may, however, have a significant influence on surface portions exposed to the corresponding reactive ambient, such as semiconductor material, dielectric material and the like.

FIG. 1b schematically illustrates the semiconductor device 100 during a conventional resist strip process 106 in order to efficiently remove the resist mask 104, wherein the process 106 may be configured as a plasma process based on oxygen and a further reactive component, such as fluorine in the form of carbon hexa fluoride, in order to etch through the crust layer 104A. During the exposure to the ambient of the process 106, exposed surface portions 125 within the second device region 120 may be damaged by the reactive components contained in the ambient of the process 106, thereby resulting in a significant material removal. For instance, carbon fluoride is well known to remove silicon, silicon dioxide, and the like during a corresponding plasma-based process, which may thus result in a significant amount of material loss in respective exposed device areas, which may impose significant issues during further manufacturing stages with respect to appropriately adjusting the overall transistor characteristics, in particular when highly scaled devices are considered. For example, a material loss of up to a thickness of approximately 2 nm, as indicated by the dashed line, may occur during the process 106 and subsequent chemical cleaning processes for removing any residuals of the resist mask 104, which may not be acceptable for devices of 65 nm technologies and beyond. In particular, the significant material loss of exposed device areas may not only result in corresponding thickness fluctuations, depending on the specific process conditions in the various device regions 110, 120, but may also result in a significant loss of dopants, thereby directly influencing the transistor performance. Consequently, on the one side, well-established oxygen plasma etch processes for stripping resist materials may no longer be appropriate due to the creation of the highly stable crust layer 104A, while, on the other hand, adding additional reactive components, such as carbon fluorine, may contribute to a significant material loss and, thus, a potential dopant loss, which may result in significant process non-uniformity and device degradation when highly scaled semiconductor devices are considered.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to a technique for removing resist materials after high dose implantation processes on the basis of a plasma-based process in combination with a wet chemical etch process, wherein respective process conditions are selected such that a significantly reduced loss of material of exposed device areas may be achieved. By providing a plasma-based process as a first part of the entire removal process, appropriate reactive components may be used in order to prepare a resist mask for an efficient etch attack by well-established wet chemical chemistries, which provide a high degree of selectivity with respect to exposed substrate materials, such as silicon, silicon dioxide and the like. Consequently, both steps, i.e., the plasma-based phase and the wet chemical process, may have enhanced selectivity, thereby resulting in significantly reduced material removal in exposed device areas.

According to one illustrative embodiment, a method comprises a plasma-based etch process in an oxygen and hydrogen containing atmosphere for removing material of a resist mask formed above a first device region of a semiconductor device, wherein the resist mask comprises a crust layer formed during a high-dose implantation process for introducing an implant species into a second device region that is not covered by the resist mask. The method further comprises performing a wet chemical etch process after the plasma-based etch process, wherein the wet chemical etch process is configured to selectively remove the resist mask including the crust layer.

According to another illustrative embodiment, a method comprises providing a resist mask above a substrate configured to form semiconductor devices, wherein the resist mask covers a first device region of the substrate and exposes a second device region. Furthermore, a high-dose implantation process is performed in order to selectively introduce a dopant species into the second device region. The method further comprises removing a first portion of the resist mask by a plasma-based etch process on the basis of an oxygen containing ambient and removing a second portion of the resist mask by a wet chemical etch process.

According to yet another illustrative embodiment, a method comprises forming a protective layer above a resist mask that covers a first device region of a semiconductor device and exposes a second device region, wherein the resist mask comprises a crust layer formed during a high-dose implantation process. The method further comprises removing a portion of the protective layer and the resist mask by a plasma etch process. Finally, the protective layer and the resist mask are substantially completely removed by a wet chemical etch process.

BRIEF DESCRIPTION OF THE DRAWINGS

The disclosure may be understood by reference to the following description taken in conjunction with the accompanying drawings, in which like reference numerals identify like elements, and in which.

Figure 1A:
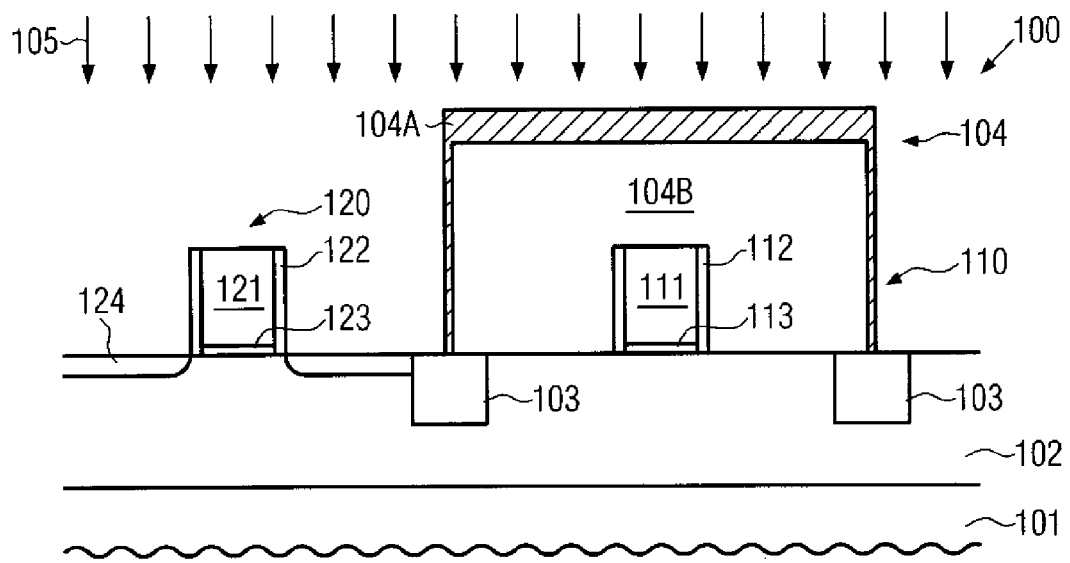
FIGS. 1a-1b schematically illustrate cross-sectional views of a sophisticated semiconductor device during the formation of an implant region on the basis of a high-dose implantation process using a resist mask that is removed on the basis of conventional strategies.
Figure 1B:
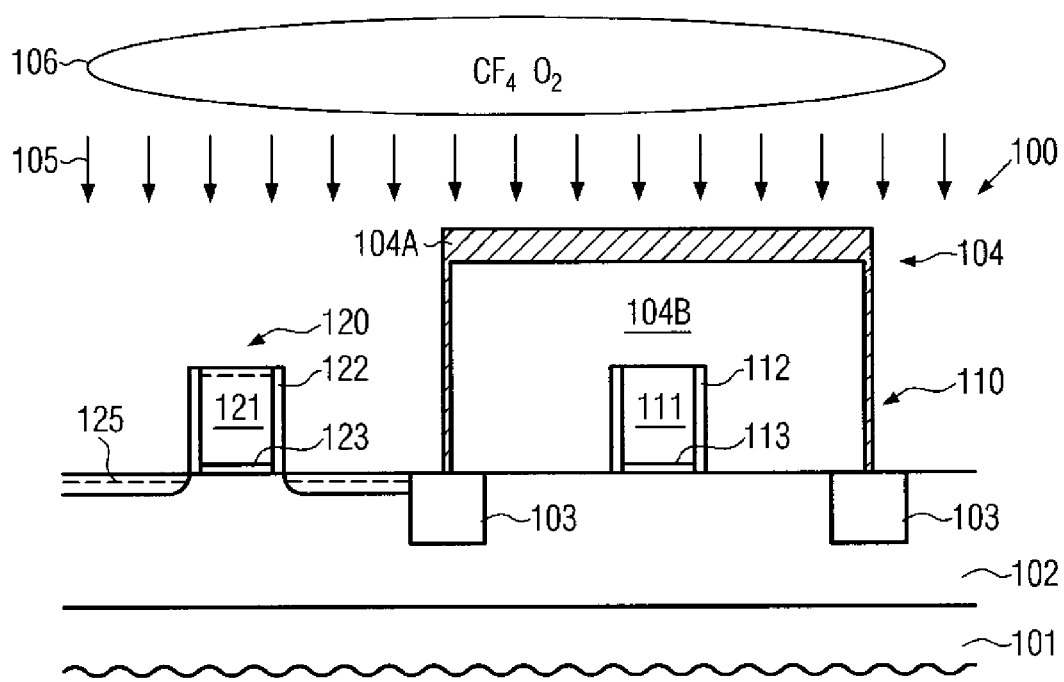

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to a technique for efficiently removing resist material used during high-dose implantation processes as an implantation mask, wherein any unwanted material removal of semiconductor material, oxide material, other dielectric materials and the like may be significantly reduced compared to conventional strategies. For this purpose, in one aspect, the removal process may comprise a plasma-based etch step, in which an appropriate etch chemistry may result in moderate removal of crust material of the resist mask, for instance at sidewall portions thereof, while not unduly interacting with other exposed device areas. Consequently, in a second highly selective wet chemical etch process, the etch chemistry may efficiently attack the non-implanted resist material on the basis of the previously highly damaged crust layer portions so as to finally lift off the main portion of the crust layer. Consequently, the dry etch process and the wet chemical etch process may be performed with high selectivity to any exposed substrate material, such as silicon, silicon dioxide, silicon nitride and the like, thereby reducing an unwanted material removal and, thus, dopant loss. In other aspects of the present invention, an appropriate protective layer may be formed prior to a first plasma-based etch process, thereby reducing the effect of the plasma-based chemistry on exposed device areas, while nevertheless preparing the resist mask including the crust layer for a subsequent efficient wet chemical etch process, which may also efficiently remove the material of the protective layer. Consequently, an enhanced degree of flexibility may be provided with respect to the selection of the etch chemistry of the plasma-based process so that even carbon fluorine containing etch chemistry may be used during the fist plasma-based etch process.

It should be appreciated that the subject matter disclosed herein may be highly advantageous in the context of semiconductor devices including transistor elements having a critical dimension, for instance the gate length thereof, of approximately 50 nm or significantly less, since, for corresponding transistor elements, a high dopant concentration with reduced penetration depth may be required to form extremely shallow PN junctions, as is previously explained. Thus, in this case, according to the present disclosure, repeated resist strip processes may be performed without unduly damaging the corresponding substrate materials. The principles disclosed herein may, however, also be applied to any situation of forming microstructure devices, in which high-dose implantation processes are to be performed on the basis of respective resist masks, while a significant removal of substrate material may not be tolerable, irrespective of the device features to be formed in and above the corresponding substrate material. Thus, the present invention should not be construed as being restricted to any specific device configurations or transistor architectures, unless such restrictions are explicitly set forth in the specification or the appended claims.

Figure 2A:
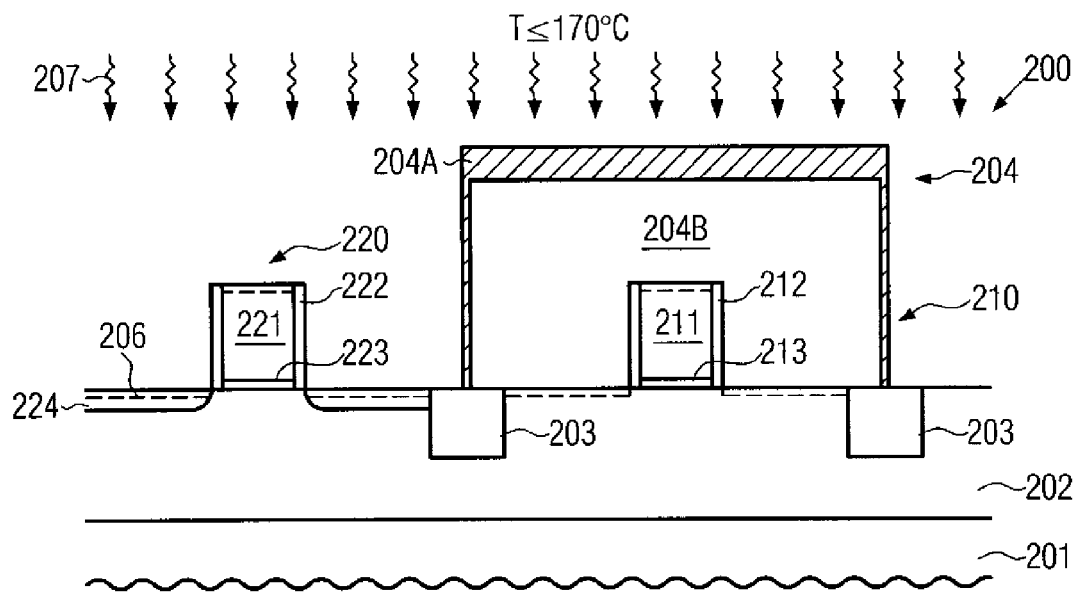
FIGS. 2a-2d schematically illustrate cross-sectional views of a semiconductor device during various manufacturing stages in defining shallow implantation regions on the basis of a resist mask and removing the same with reduced material loss.

FIG. 2a schematically illustrates a semiconductor device 200 comprising a substrate 201 having formed thereon a device layer 202, which may be considered as any appropriate substrate material that requires the incorporation of a shallow implant species, such as a dopant material. In some illustrative embodiments, the device layer 202 may be represented by a semiconductor layer comprised of any appropriate semiconductor material, such as silicon, silicon/germanium or any II-VI or III-V semiconductor compounds. Similarly, the substrate 201 may represent any appropriate carrier material for providing thereon the device layer 202, wherein, in some illustrative embodiments, the substrate 201, in combination with the device layer 202, may define an SOI configuration, i.e., the device layer 202 may represent a semiconductor layer formed on a buried insulating layer (not shown), which separates the device layer 202 from conductive materials provided in the substrate 201. Furthermore, the semiconductor device 200 may comprise a first device region 210 and a second device region 220, which may define respective areas in the device layer 202 requiring shallow implantation regions of different configuration. For example, the first and second device regions 210, 220 may be defined on the basis of respective isolation structures 203, such as a shallow trench isolation or any other appropriate configuration, which may be comprised of any appropriate dielectric material, such as silicon dioxide, silicon nitride, silicon oxynitride and the like. The first and second device regions 210, 220 may be dimensioned such that respective device features, such as transistors, or any other circuit elements may be formed in an appropriate number and configuration as demanded by device requirements. In one illustrative embodiment, the first and the second device regions 210, 220 may represent respective active regions of semiconductor material, the conductivity of which may be "patterned" so as to obtain PN junctions for establishing an appropriate transistor performance. For example, at least one of the device regions 210, 220 may require a shallow implantation region, such as a region 224 formed in the second device region 220, including a dopant species of a specified conductivity type. Similarly, a respective implantation region may be formed in the first device region 210 in a later manufacturing stage. In some illustrative embodiments, when the first and the second device regions 210, 220 represent respective active transistor areas, respective device features, such as gate electrodes 211, 221 or any other features, such as place holder structures acting as implantation masks and the like, may be provided in this manufacturing stage. The gate electrodes 211, 221 may be formed on respective gate insulating layers 213, 223 separating the gate electrodes 211, 221 from the material of the device layer 202. As previously explained with reference to the device 100, in sophisticated applications, a respective gate length may be 50 nm or significantly less, for example 30 nm or less. The gate electrodes 211, 221 may have formed on sidewall portions thereof respective spacer structures 212, 222, respectively, which may have a thickness in accordance with device requirements. Furthermore, in some illustrative embodiments, a respective screening or pad layer 206 may be formed on exposed portions of the material 202 and possibly on the respective gate electrodes 211, 221, wherein the pad layer 206 may be comprised of any appropriate material, such as silicon dioxide, silicon nitride or other well-approved dielectric materials typically used in manufacturing sequences for forming semiconductor devices. Furthermore, in this manufacturing stage, a respective resist mask 204 may be provided so as to cover the first device region 210 and expose the second device region 220, wherein the resist mask 204 may comprise a modified portion indicated as a crust layer 204A, in which chemical and mechanical characteristics may significantly differ from resist material 204B which may have substantially not been affected by an ion bombardment previously performed in order to define the implantation region 224.

The semiconductor device 200 as shown in FIG. 2a may be formed on the basis of the following processes. After providing the substrate 201 having formed thereon the device layer 202, the first and second device regions 210, 220 may be defined, for instance on the basis of the isolation structures 203, which may be formed on the basis of well-established techniques, as are also described with reference to the device 100. Thereafter, implantation processes may be performed for establishing a vertical profile within the first and the second regions 210, 220, if required, and thereafter respective device features may be formed, if required. For instance, the gate electrodes 211, 221, including the spacer structure 212, 222 and the gate insulation layers 213, 223, may be formed on the basis of process techniques as previously described with reference to the semiconductor device 100 when respective transistor elements are to be formed in the first and second regions 210, 220. Next, the pad layer 206, if provided, may be formed on the basis of well-established oxidation and/or deposition techniques followed by the formation of the resist mask 204 on the basis of well-established photolithography processes. Subsequently, the device 200 may be subjected to an ion implantation process on the basis of appropriate process parameters, wherein typically a high dose is to be used in order to obtain a high dopant concentration in the implant region 224 as required by design rules. For instance, the implant region 224 may represent an extension region of drain and source regions of a transistor device to be formed in the second device region 220, thereby requiring a dopant concentration of approximately $10^{19}$-$10^{20}$ atoms per cubic cm or even higher, which may require implantation doses of approximately $10^{15}$ ions/cm$^2$ and even significantly higher. Thus, a high-dose implantation process is to be understood as an implantation process performed on the basis of an implantation dose of at least $10^{15}$ ions/cm$^2$. Since the average penetration depth is moderately low in order to obtain shallow PN junctions in the vicinity of the gate electrode 221, when sophisticated transistor elements are considered, extremely low implantation energies of approximately 10 keV or significantly less or even 3 keV or less may be used. Consequently, the interaction of the implant species with resist material of the mask 204 is restricted to exposed surface areas of the mask 204, wherein typically non-tilted implantation process steps are mainly performed, thereby resulting in an increased thickness of the crust layer 204A at horizontal portions, while the corresponding vertical sidewall portions of the mask 204 may have a significantly reduced thickness. Consequently, an efficient etch attack may be established at the sidewall portions on the basis of a highly selective plasma etch chemistry so as to prepare the resist mask 204 for a subsequent efficient etch attack of a wet chemical etch chemistry as will be described later on.

At the manufacturing stage shown in FIG. 2a, the semiconductor device 200 may be treated to adjust a process temperature for a subsequent resist removal process to a value of approximately 170° C. and less in order to substantially avoid any undue chemical reaction of the resist material 204B, for instance by forming respective cross linkings, which may occur at moderately high temperatures typically used during conventional plasma-based resist strip processes. In one illustrative embodiment, the process temperature is maintained in a range of approximately 170-160° C., wherein the respective process temperature may be considered as a respective temperature determined on the substrate 201 when substantially being in a thermal equilibrium state. The desired process temperature may be established on the basis of a heat treatment 207 performed in a process chamber configured to maintain the desired process temperature during a subsequent plasma-based etch process.

Figure 2B:
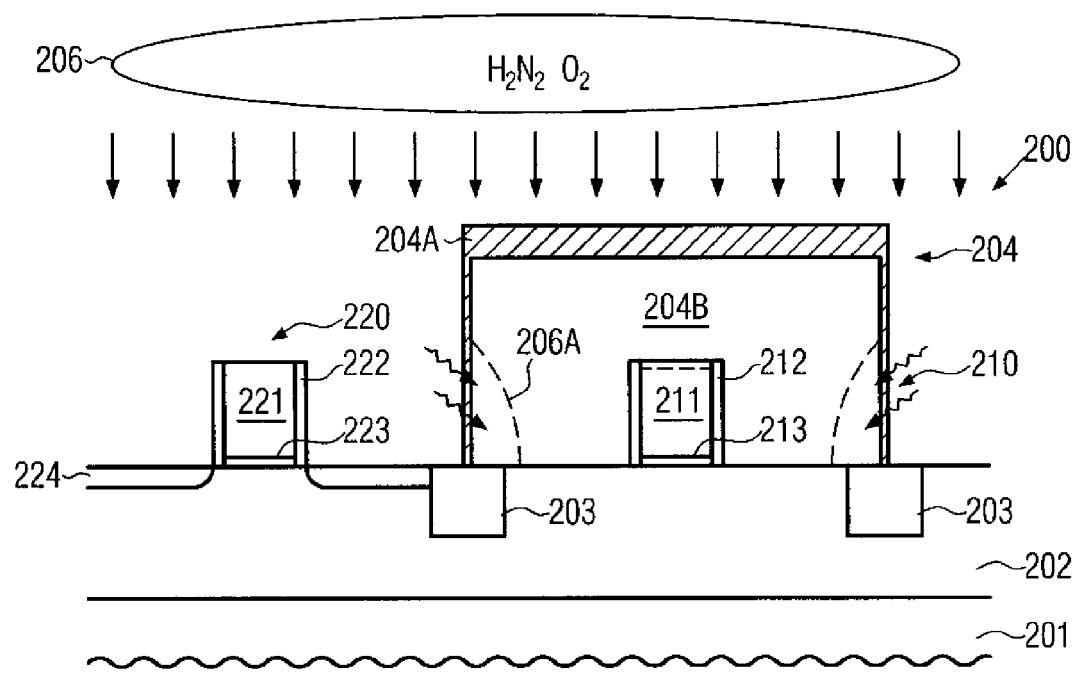

FIG. 2b schematically illustrates the semiconductor device 200 during a plasma-based etch process 206 designed to remove a portion of the resist mask 204. In this embodiment, the respective reactive ambient of the plasma etch process 206 may contain oxygen and a forming gas, i.e., a gas mixture containing hydrogen and nitrogen, thereby providing a reduced removal rate of exposed substrate materials in the second device region 220. In one illustrative embodiment, the ambient of the plasma process 206 may be established in a substantially fluorine-free environment, which is to be understood as an environment in which the supply of fluorine containing precursor gases is prevented, while nevertheless any unwanted traces of fluorine may be present due to imperfections of the process tool, process tool contamination and the like. In some illustrative embodiments, the ambient of the plasma process 206 may be established on the basis of oxygen and a forming gas, wherein the fraction of the forming gas, i.e., the gas mixture of hydrogen/nitrogen is higher than the corresponding fraction of oxygen. For example, the fractions of forming gas compared to oxygen in terms of mols may be adjusted such that the amount of forming gas is higher than the amount of oxygen throughout the entire plasma-based process 206. In one illustrative embodiment, the ratio of forming gas to oxygen is adjusted to approximately 2:1. Due to the absence of significant amounts of other reactive components as are typically used in conventional approaches, such as carbon fluorine, material removal at the exposed second device region 220 may be significantly reduced compared to the conventional plasma etch process 106, while nevertheless a certain amount of the crust layer 204A, especially at sidewall portions of the resist mask 204, may be removed, thereby increasingly etching through the crust layer 204A and also removing non-implanted resist material 204B, as indicated by the dashed lines 206A.

Figure 2C:
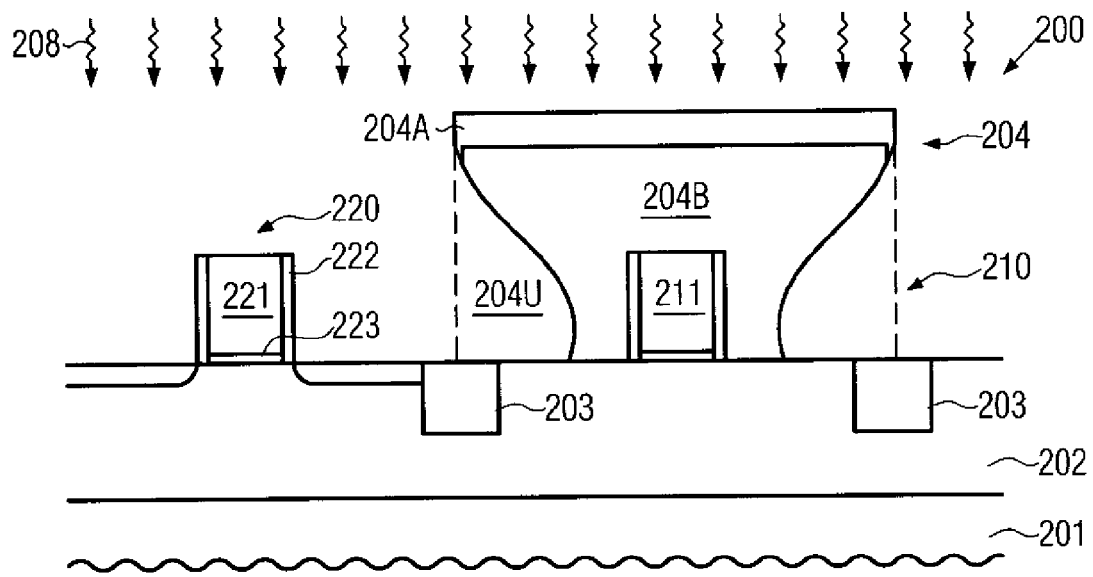

FIG. 2c schematically illustrates the semiconductor device 200 after the completion of the plasma-based etch process 206, resulting in respective under-etched portions 204U having surface portions that are substantially formed by non-implanted resist material 204B. Consequently, the resist mask 204 is now in a condition to provide sufficiently exposed surface areas for an etch attack of a wet chemical etch process 208 designed to efficiently remove the material 204B, thereby also lifting off the residue of the crust layer 204A. For this purpose, in some illustrative embodiments, well-established highly selective wet chemical etch recipes may be used, which may not substantially attack exposed substrate areas of the first and second device regions 210, 220 while efficiently removing the material 204B. In one illustrative embodiment, an etch solution on the basis of sulphur-containing components may be used. For instance, a sulphuric peroxide mixture (SPM) and an ammonia peroxide mixture (APM) may be used in accordance with well-established wet chemical etch recipes. Consequently, the under-etched portions 204U may be efficiently increased, thereby resulting in a peeling off or lifting off of the crust layer 204A, thereby mechanically removing the crust layer 204A which per se may not be efficiently chemically resolved by the wet chemical etch recipe of the process 208. As a consequence, undue material removal in the device regions 210, 220 may be suppressed while nevertheless efficiently removing the resist mask 204 on the basis of the plasma etch process 206 and the wet chemical etch process 208.

Figure 2D:
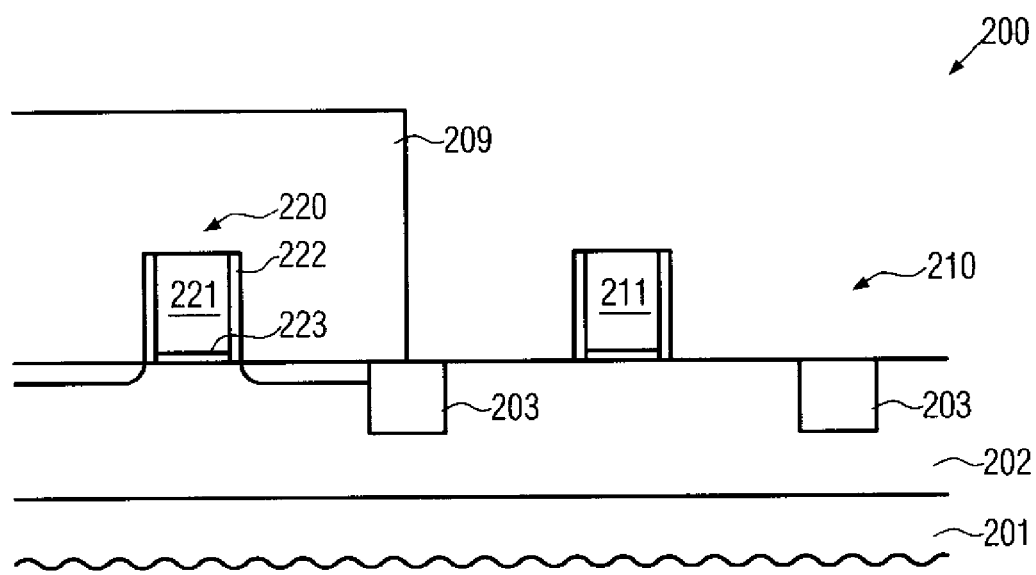

FIG. 2d schematically illustrates the semiconductor device 200 after the resist strip process including the steps 206 and 208 with a further resist mask 209 designed to protect the second device region 220 during a further high-dose implantation step for creating a corresponding implant region in the first device region. Thereafter, the resist mask 209 may be efficiently removed by repeating the steps 206 and 208, as previously explained, thereby providing the potential for significantly reducing process non-uniformities and performance losses of respective transistor elements to be formed in the first and second device regions 210, 220. As a consequence, even repeated resist removal processes, as are typically required in a complex manufacturing sequence for forming sophisticated transistor elements, may be performed without significant loss of substrate material and, thus, dopant species, wherein, additionally, reduced process times for the plasma-based etch step 206 may be achieved compared to conventional plasma-based resist strip processes. The reduced process time in combination with an appropriate etch chemistry may further result in reduced etch induced damage on active areas during the plasma-based etch step 206. Furthermore, a relatively simple gas chemistry during the plasma-based etch process 206, i.e., a combination of forming gas and oxygen, may be used in the illustrative embodiments described above, while, additionally, a high degree of independence of the corresponding resist strip process may be achieved with respect to the implanted concentration of dopant species. Thus, respective process parameters for the processes 206 and 208 may be established for a plurality of different high-dose implantation recipes, thereby substantially avoiding time-consuming process adaptations for different implantation processes, as are typically encountered in the complex manufacturing sequence for forming highly scaled transistor devices.

With reference to FIGS. 3a-3d, further illustrative embodiments will now be described in more detail, in which plasma-induced damage may be even further reduced by providing an appropriate protective layer prior to performing a plasma etch process.

Figure 3A:
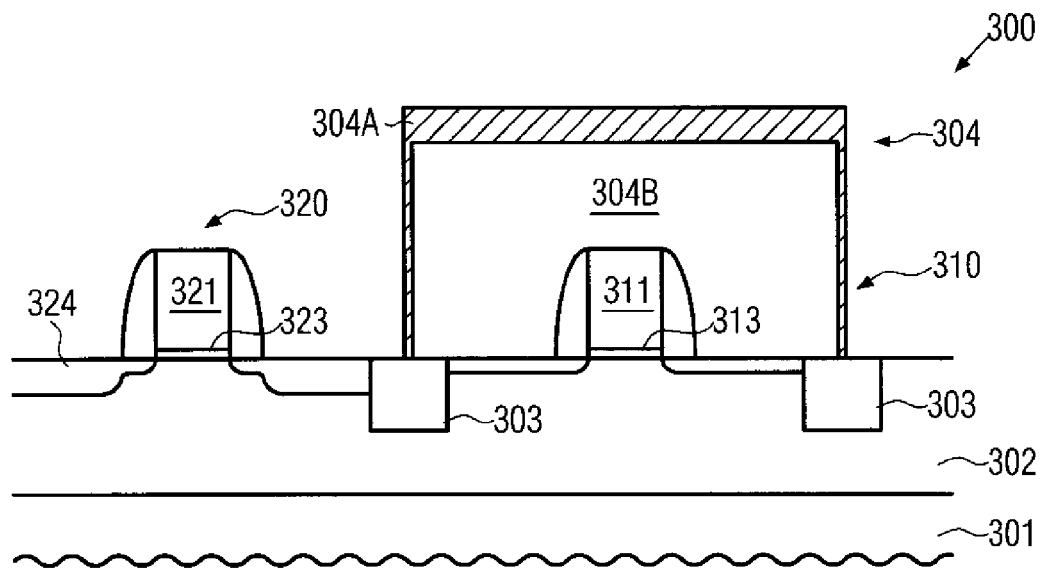
FIGS. 3a-3d schematically illustrate cross-sectional views of a semiconductor device during various manufacturing stages in removing an implantation resist mask on the basis of an additional protection layer.

FIG. 3a schematically illustrates a cross-sectional view of a semiconductor device 300 comprising a substrate 301 having formed thereon a device layer 302, such as a semiconductor layer and the like. Furthermore, a first device region 310 and a second device region 320 may be defined, for instance on the basis of respective isolation structures defined as gate electrodes 311, 321, including sidewall spacer structures 312, 322, and corresponding gate insulation layers 313, 323 may be provided in the respective device regions 310, 320, wherein, for these components, substantially the same criteria may apply as previously described with reference to the devices 200 and 100. Furthermore, a respective implant region 324 may have been formed in the second device region 320 on the basis of a resist mask 304, which may therefore comprise a crust layer 304A and a substantially non-affected material 304B as is previously explained. The implant region 324 may represent any device area to be modified by ion implantation on the basis of device requirements, such as source/drain extensions, deep drain and source regions and the like. It should be appreciated that the process of forming the implant region 324 may comprise a plurality of implantation processes such as pre-amorphization implantations and the like which may be performed at a high dose, depending on the requirements, thereby contributing to the occurrence of the crust layer 304A.

Figure 3B:
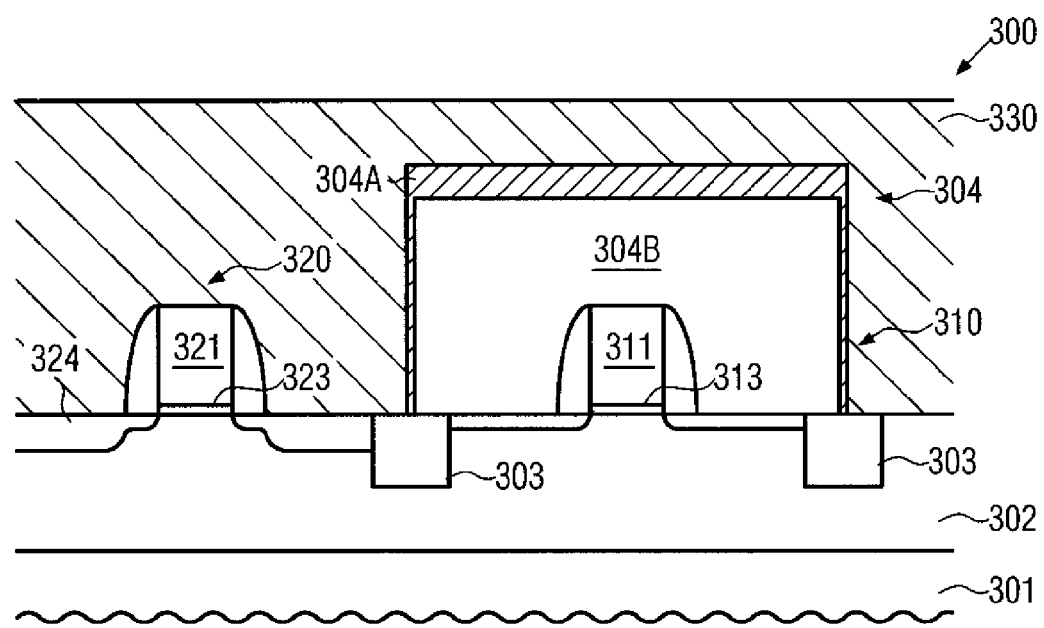

FIG. 3b schematically illustrates the semiconductor device 300 in a further advanced manufacturing stage, in which a protection layer 330 may be formed at least above the second device region 320, wherein, in some illustrative embodiments, the protection layer 330 may also be formed above the resist mask 304. In some illustrative embodiments, the protection layer 330 may be comprised of a material having the same etch characteristics compared to the material 304B so that these materials may be efficiently removed in a common etch process, as described later on. For example, the protection layer 330 may be comprised of resist material corresponding to the material 304B, which may have been exposed in order to provide substantially the same chemical composition. In other illustrative embodiments, the resist material for the protection layer 330 may be provided as a substantially non-exposed resist material when a similar etch behavior of non-exposed and exposed resist material is obtained. In other cases, the protection layer 330 may be provided in the form of any appropriate polymer material having a similar etch behavior relative to the material 304B. The protection layer 330 may be formed on the basis of well-established spin-on techniques, thereby providing the highly non-conformal deposition behavior for reliably covering the second device region 320. After the deposition of the protection layer 330, the layer 330 may, if required, be treated, for instance by exposure or any other treatment, such as curing and the like, in order to obtain the desired mechanical and chemical characteristics. In one illustrative embodiment, the device 300 may be subjected to a mechanical polishing process, possibly in combination with chemical substances (CMP), in order to remove excess material of the protection layer 330 and also mechanically remove at least a portion of the crust layer 304A. In this case, the protection layer 330 may efficiently avoid undue polishing induced damage in the second device region 320, wherein even a significantly different removal rate of the material of the protection layer 330 compared to the material of the crust layer 304A may be acceptable, since a significant portion of the protection layer 330 may still remain during the removal of a significant portion of the crust layer 304A. In some illustrative embodiments, the material 304B of the resist mask 304 may be substantially completely exposed during a polishing process, except for respective vertical sidewall portions. Thereafter, an appropriately designed plasma-based and/or wet chemical etch process may be performed in order to completely remove the resist mask 304 and the protection layer 330 in a common etch process. For this purpose, a combination of a plasma-based etch process and a wet chemical etch process may be performed, wherein plasma-induced damage may be even further reduced due to the provision of the protection layer 330.

Figure 3C:
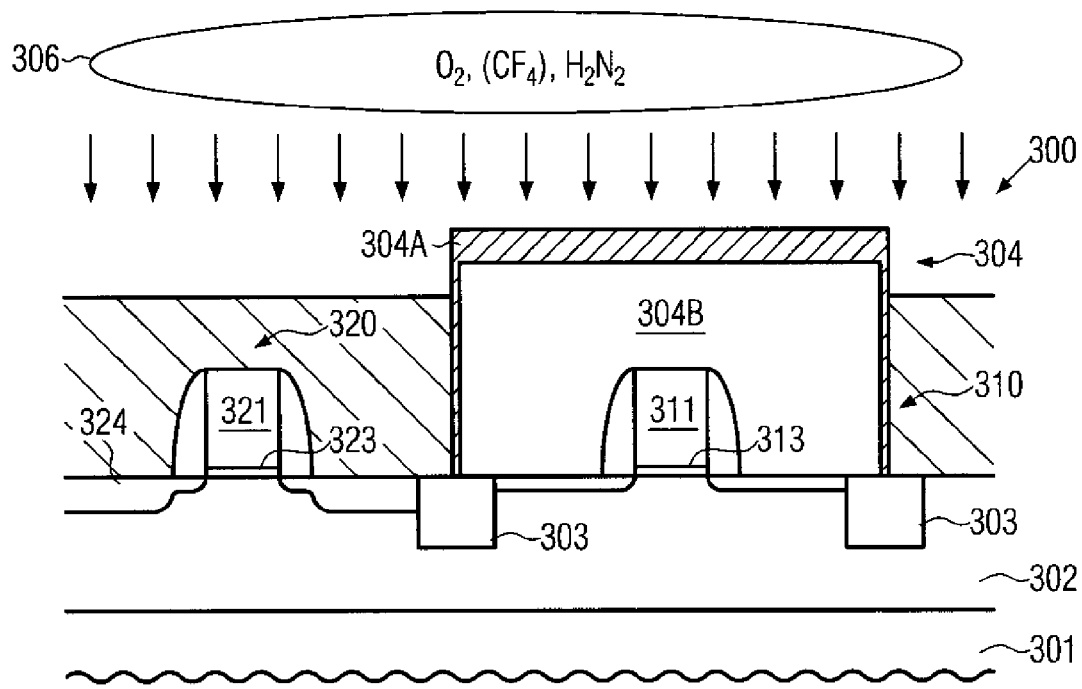

FIG. 3c schematically illustrates the semiconductor device 300 according to one illustrative embodiment, wherein the device 300 is subjected to a plasma-based etch process, possibly with a preceding mechanical polishing process, as previously described. In other cases, the device 300 as shown in FIG. 3b may be subjected to a plasma-based etch process 306 having an etch chemistry on the basis of oxygen and a forming gas, i.e., a hydrogen/nitrogen gas mixture, as previously described with reference to the plasma etch process 206. Also, in this case, excess material of the protection layer 330 may be efficiently removed during the process 306, wherein the increased removal rate of the protection layer 330 compared to the crust layer 304A may increasingly expose sidewall portions of the resist mask 304, thereby also removing material of the crust layer 304A, as is previously explained. Thus, material 304B may be exposed while nevertheless an efficient protection of the second device region 320 may be achieved on the basis of the remaining protection layer 330. If a preceding polishing process has been performed, even horizontal portions of the material 304B may be exposed during the process 306, thereby efficiently preparing the device 300 for a subsequent wet chemical etch process.

Figure 3D:
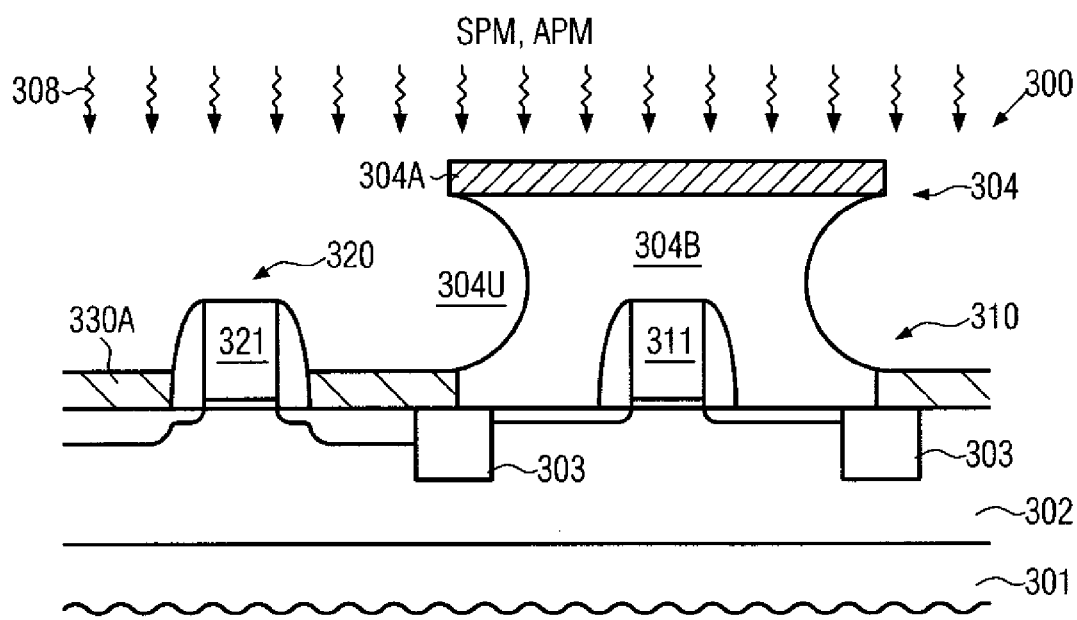

FIG. 3d schematically illustrates the semiconductor device 300 after the completion of the plasma etch process 306 and during a corresponding wet chemical etch process 308, which may be performed on the basis of appropriately selected process parameters as previously described with respect to the wet chemical etch process 208. Consequently, any under-etched portions 304U created during the preceding plasma etch process 306 may provide surface areas of the material 304B at which the etch chemistry of the process 308 may attack the resist mask 304 while also efficiently removing the residual of the protection layer 330, indicated as 330A. Thus, during the wet chemical etch process 308, the main portions of the crust layer 304A may be mechanically removed as previously described while efficiently removing the material 304B and the layer 330A. Thus, the resist mask 304 may be removed in an efficient manner while still further reducing any plasma etch induced damage of exposed device areas, thereby contributing to an enhanced uniformity of surface characteristics after the resist removal process. Moreover, since the protection layer 330 may provide reliable coverage of the second device region 320 during the process 306, additional reactive components, such as fluorine containing precursor gases, may be used, for instance in combination with a forming gas and oxygen in order to more efficiently remove material of the crust layer 304A. Hence, the process time of the process 306 may be reduced while additionally providing a high degree of flexibility in establishing an appropriate gas ambient during the plasma process 306, since may types of etch chemistries may be used since pronounced selectivity with respect to substrate material may not be required.

As a result, the present disclosure is directed to an enhanced technique for removing resist masks after high-dose implantation processes, wherein material loss, and, thus, potential dopant loss may be significantly reduced by performing, in some illustrative embodiments, a resist strip process including a plasma-based process and a wet chemical etch process. For this purpose, both process steps may be designed to exhibit a high selectivity with respect to exposed substrate material, such as doped silicon, silicon dioxide, silicon nitride and the like, wherein the first plasma-based etch process may "prepare" the resist mask including a highly stable crust layer for the subsequent wet chemical etch process. Thus, in a first step, a significant portion of the resist mask is removed, thereby exposing substantially non-implanted resist material in the form of under-etched portions, which may thereafter be efficiently removed on the basis of a highly selective wet chemical etch recipe, thereby also mechanically removing residuals of the crust layer.

The resist strip removal process may be preceded by the formation of a protection layer in order to even further reduce plasma-induced substrate damage, while not unduly contributing to overall process complexity. In some aspects, the removal of the crust layer may be enhanced by performing a polishing process in order to enhance the efficiency of the subsequent resist strip process, which may include a plasma-based process and/or a wet chemical etch process with high selectivity with respect to the substrate material.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   positioning a substrate in a semiconductor tool, wherein a resist mask formed above a first device region of said substrate comprises a resist material and a crust layer formed from said resist material on exposed surfaces of said resist mask during an implantation process for introducing an implant species into a second device region of said substrate not covered by said resist mask;
   performing a plasma-based etch process in an oxygen and hydrogen containing atmosphere to remove at least a first portion of said crust layer and at least a first portion of said resist material thereunder, and wherein at least a second portion of said crust layer remains on an upper surface of said resist mask; and
   performing a wet chemical etch process after said plasma-based etch process to selectively remove a remaining portion of said resist material of said resist mask.

2. The method of claim 1, further comprising adjusting a process temperature at least during said plasma-based etch process to approximately 170° C. or less.

3. The method of claim 2, wherein said process temperature is adjusted to a range of approximately 170° C. to 160° C.

4. The method of claim 1, wherein said hydrogen and oxygen containing atmosphere is established by using a hydrogen/nitrogen gas mixture and oxygen.

5. The method of claim 4, wherein a mol fraction of said hydrogen/nitrogen gas mixture supplied to said atmosphere is higher than a mol fraction of said oxygen.

6. The method of claim 5, wherein a ratio of said hydrogen/nitrogen gas mixture and said oxygen is maintained at approximately 2:1 during said plasma-based etch process.

7. The method of claim 1, wherein said wet chemical etch process comprises a sulfur and ammonia based etch chemistry.

8. The method of claim 1, wherein said crust layer is created during an implantation process performed with an implantation energy of approximately 10 keV or less and with a dose of approximately $10^{15}$ ions/cm$^2$ or higher.

9. The method of claim 1, further comprising forming a non-implanted resist layer above said second device region prior to performing said plasma-based etch process.

10. The method of claim 1, wherein said ion implant process is performed with a dopant dose of at least $10^{15}$ ions/cm$^2$.

11. The method of claim 1, wherein said plasma-based etch process is performed in a substantially fluorine-free ambient.

12. A method, comprising:
    forming a resist mask comprising a resist material above a semiconductor substrate, said resist mask being patterned to cover a first region of said substrate and expose a second region of said substrate;
    performing an implantation process to introduce a dopant species into said second region, said implantation process forming a crust material on exposed surfaces of said resist mask covering said first region, wherein a thickness of said crust material on an upper surface of said resist mask is greater than a thickness of said crust material on side surfaces of said resist mask, said crust material covering a non-implanted portion of said resist material comprising said resist mask;
    removing a first portion of said resist mask by performing a plasma-based etch process on the basis of an oxygen containing ambient, said first portion of said resist mask comprising a first portion of said crust material on said upper surface of said resist mask, substantially all of said crust material on said side surfaces of said resist mask, and a first portion of said non-implanted resist material; and
    removing a residual portion of said resist mask, wherein removing said residual portion of said resist mask comprises performing a wet chemical etch process adapted to remove a remaining portion of said non-implanted resist material of said resist mask and mechanically remove a residual portion of said crust material on said upper surface of said resist mask.

13. The method of claim 12, wherein said implantation process is performed at an implantation energy of approximately 3 keV or less.

14. The method of claim 12, wherein said ion implant process is performed with a dopant dose of at least $10^{15}$ ions/cm$^2$.

15. The method of claim 13, wherein said oxygen containing ambient is created by using a hydrogen/nitrogen gas mixture and oxygen.

16. The method of claim 12, further comprising adjusting a process temperature to approximately 170° C. or less.

17. The method of claim 15, wherein said oxygen containing ambient is a substantially fluorine-free ambient.

* * * * *